US010256089B2

(12) United States Patent
Cao et al.

(10) Patent No.: US 10,256,089 B2
(45) Date of Patent: Apr. 9, 2019

(54) REPLACEMENT CONTACT CUTS WITH AN ENCAPSULATED LOW-K DIELECTRIC

(71) Applicant: GLOBALFOUNDRIES Inc., Grand Cayman (KY)

(72) Inventors: Huy Cao, Rexford, NY (US); Haigou Huang, Rexford, NY (US); Jinsheng Gao, Ballston Spa, NY (US); Tai Fong Chao, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/626,732

(22) Filed: Jun. 19, 2017

(65) Prior Publication Data

US 2018/0366324 A1 Dec. 20, 2018

(51) Int. Cl.
*H01L 29/417* (2006.01)
*H01L 21/02* (2006.01)
(Continued)

(52) U.S. Cl.
CPC ...... *H01L 21/02378* (2013.01); *H01L 21/022* (2013.01); *H01L 21/02126* (2013.01); *H01L 21/02167* (2013.01); *H01L 21/28255* (2013.01); *H01L 21/76832* (2013.01); *H01L 21/76837* (2013.01); *H01L 21/76888* (2013.01); *H01L 29/41775* (2013.01)

(58) Field of Classification Search
CPC ......... H01L 21/02126; H01L 21/02167; H01L 21/022; H01L 21/28194; H01L 21/443; H01L 21/76802; H01L 21/76816; H01L 21/76831; H01L 21/76832; H01L 21/76834; H01L 21/76835; H01L 21/76837; H01L 21/76888; H01L 23/5222; H01L 23/5283; H01L 23/53295; H01L 29/0653; H01L 29/41725; H01L 29/41775

See application file for complete search history.

(56) References Cited

U.S. PATENT DOCUMENTS 7,666,746 B2 * 2/2010 Gambino ............ H01L 29/4983
438/197
9,390,979 B2 7/2016 Wei et al.
(Continued)

OTHER PUBLICATIONS

Huy Cao et al., "Airgaps to Isolate Metallization Features", U.S. Appl. No. 15/377,592, filed Dec. 13, 2016.

*Primary Examiner* — Stephen W Smoot
(74) *Attorney, Agent, or Firm* — Thompson Hine LLP; Anthony Canale

(57) ABSTRACT

Interconnect structures and methods of forming an interconnect structure. A sacrificial contact is arranged between a first gate structure and a second gate structure. The sacrificial contact extends vertically to a source/drain region. A section of the sacrificial contact is removed to form a cut opening extending vertically to the source/drain region. A first dielectric layer is deposited in the cut opening, and is then partially removed to open a space in the cut opening that is arranged vertically above the first dielectric layer. A second dielectric layer is deposited that fills the space in the cut opening and forms a cap on the first dielectric layer. The first dielectric layer has a first dielectric constant, and the second dielectric layer has a second dielectric constant that is greater than the first dielectric constant.

19 Claims, 3 Drawing Sheets

(51) Int. Cl.
*H01L 21/768* (2006.01)
*H01L 21/28* (2006.01)

(56) References Cited

U.S. PATENT DOCUMENTS

| | | | |
|---|---|---|---|
| 9,466,723 B1 | 10/2016 | Huang et al. | |
| 2008/0081480 A1* | 4/2008 | Frohberg | H01L 21/31144 |
| | | | 438/703 |
| 2012/0112252 A1* | 5/2012 | Yin | H01L 21/76804 |
| | | | 257/288 |
| 2015/0214330 A1* | 7/2015 | Wan | 438/595 |
| 2016/0225629 A1* | 8/2016 | Ando | H01L 21/02164 |

* cited by examiner

REPLACEMENT CONTACT CUTS WITH AN ENCAPSULATED LOW-K DIELECTRIC

BACKGROUND

The present invention relates to semiconductor device fabrication and integrated circuits and, more specifically, to interconnect structures and methods of forming an interconnect structure.

Device structures for a field-effect transistor generally include a body region, a source and a drain defined in the body region, and a gate structure configured to apply a control voltage that switches carrier flow in a channel formed in the body region. When a control voltage that is greater than a designated threshold voltage is applied, carrier flow occurs in the channel between the source and drain to produce a device output current.

Contacts may provide vertical electrical connections to features of semiconductor devices, such as the gate structure and source/drain regions of a field-effect transistor. Self-aligned contacts (SAC) are formed in contact openings that are constrained during etching by the configuration of adjacent structures, e.g., sidewall spacers on adjacent gate structures, as opposed to being constrained by a patterned resist. For example, a self-aligned contact may be formed in a contact opening that is defined by selectively etching one material, e.g., silicon dioxide, of an interlayer dielectric layer relative to other materials, such as silicon nitride sidewall spacers on adjacent gate structures.

Improved interconnect structures and methods of forming an interconnect structure are needed.

SUMMARY

In an embodiment of the invention, a structure includes a first gate structure, a second gate structure, and a source/drain region arranged between the first gate structure and the second gate structure. The structure further includes a first dielectric layer arranged in a space between the first gate structure and the second gate structure, and a second dielectric layer positioned as a cap on the first dielectric layer. The first dielectric layer is arranged vertically between the second dielectric layer and the source/drain region. The first dielectric layer has a first dielectric constant, and the second dielectric layer has a second dielectric constant that is greater than the first dielectric constant.

In an embodiment of the invention, a method includes forming a sacrificial contact that is arranged between a first gate structure and a second gate structure and that extends vertically to a source/drain region. A section of the sacrificial contact is removed to form a cut opening extending vertically to the source/drain region. A first dielectric layer is deposited in the cut opening, and is then partially removed to open a space in the cut opening that is arranged vertically above the first dielectric layer. A second dielectric layer is deposited that fills the space in the cut opening and forms a cap on the first dielectric layer. The first dielectric layer has a first dielectric constant, and the second dielectric layer has a second dielectric constant that is greater than the first dielectric constant.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 7 is a top view of the structure in which FIG. 6 is taken generally along line 6-6.

DETAILED DESCRIPTION

Figure 1:
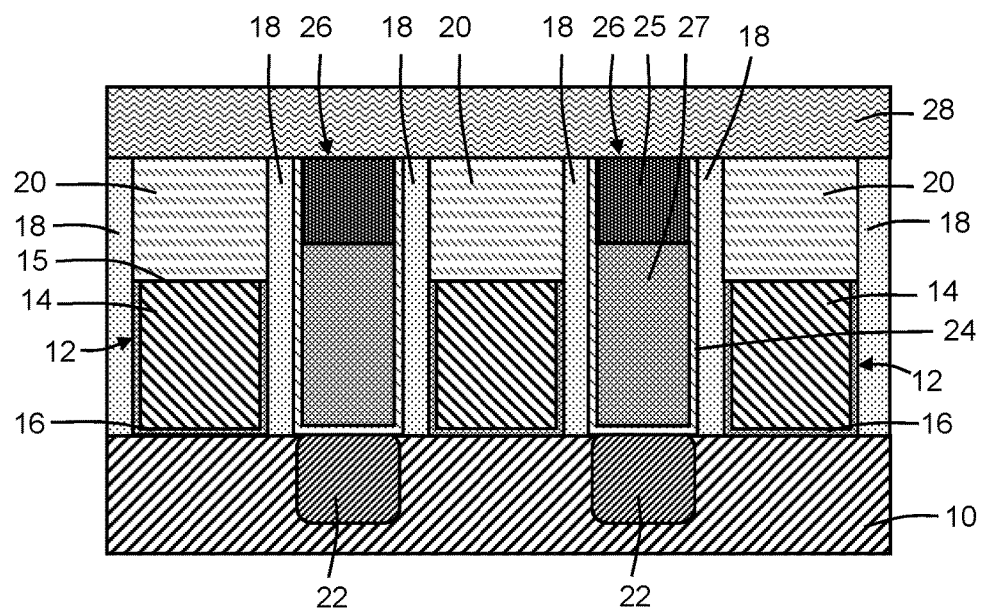
FIGS. 1-6 are cross-sectional views of a structure at successive fabrication stages of a processing method in accordance with embodiments of the invention.

With reference to FIG. 1 and in accordance with embodiments of the invention, a substrate 10 is provided that may be a bulk substrate or a device layer of a semiconductor-on-insulator (SOI) substrate. Gate structures 12 are located on a top surface of the substrate 10. Each gate structure 12 includes a gate electrode 14 and a gate dielectric 16 interposed between the gate electrode 14 and the substrate 10. The gate structures 12 may be formed by a replacement metal gate (RMG) technique in which the gate dielectric 16 and gate electrode 14 replace a sacrificial gate structure. The gate dielectric 16 may extend vertically to the level of a top surface 15 of the gate electrode 14 as shown in the representative gate structures 12 or, alternatively, may be recessed in relation to the top surface 15 of the gate electrode 14.

The gate dielectric 16 may be composed of a dielectric material, such as a high-k dielectric material like hafnium oxide ($HfO_2$) that has a dielectric constant (e.g., permittivity) higher than the dielectric constant of $SiO_2$, deposited by atomic layer deposition (ALD). The gate electrode 14 may include one or more conformal barrier metal layers and/or work function metal layers composed of conductors, such as metals (e.g., tungsten (W)) and/or metal nitrides or carbides (e.g., titanium nitride (TiN) and titanium aluminum carbide (TiAlC)), deposited by physical vapor deposition (PVD), chemical vapor deposition (CVD), etc. The barrier metal layers and/or work function metal layers of the gate electrode 14 may differ for an n-type field-effect transistor or a p-type field-effect transistor.

Sidewall spacers 18 are positioned on the top surface of the substrate at locations adjacent to the vertical sidewalls of each gate structure 12. The sidewall spacers 18 may be composed of a dielectric material, such as a low-k dielectric material like silicon oxycarbonitride (SiOCN), deposited as a conformal layer by ALD and etched with a directional etching process such as reactive ion etching (RIE). A capping layer 20 is formed on the top surface 15 of the gate electrode 14 of each gate structure 12 and in a space laterally between the sidewall spacers 18. The capping layers 20 may be comprised of a dielectric material, such as silicon nitride ($Si_3N_4$) or silicon oxycarbonitride (SiOCN), deposited by CVD.

Source/drain regions 22 are arranged in the spaces between adjacent gate structures 12 at respective locations near the top surface of the substrate 10. As used herein, the term "source/drain region" means a doped region of semiconductor material that can function as either a source or a drain of a field-effect transistor. For an n-type field-effect transistor, the semiconductor material of the source/drain regions 22 may be doped with an n-type dopant from Group V of the Periodic Table (e.g., phosphorus (P) or arsenic (As)) that is effective to impart n-type conductivity. For a p-type field-effect transistor, the semiconductor material of the source/drain regions 22 may be doped with a p-type dopant selected from Group III of the Periodic Table (e.g., boron (B)) that is effective to impart p-type conductivity. The source/drain regions 22 may be formed by, for example, ion implantation and may include raised sections.

The source/drain regions 22 are covered by a contact etch stop layer (CESL) 24, which may be constituted by a thin layer composed of silicon nitride ($Si_3N_4$). Sacrificial contacts 26 are located as dummy structures in the spaces between the gate structures 12 in vertical alignment with the source/drain regions 22. The sacrificial contacts 26 may be a layer stack that includes a layer 25 of dielectric material, such as silicon dioxide ($SiO_2$), and a layer 27 of polycrystalline semiconductor material, such as polycrystalline silicon (polysilicon). A sacrificial dielectric layer 28 is located on the planarized top surface that includes the layers 25 of the sacrificial contacts 26 and the capping layers 20 on the gate electrodes 14. The sacrificial dielectric layer 28 may be composed of a dielectric material, such as silicon dioxide ($SiO_2$).

The device structure that includes the gate structures 12 and source/drain regions 22 may be fabricated by complementary metal oxide semiconductor (CMOS) processes during front-end-of-line (FEOL) processing. The device structure may be, for example, a planar field-effect transistor or a fin-type field-effect transistor.

Figure 2:
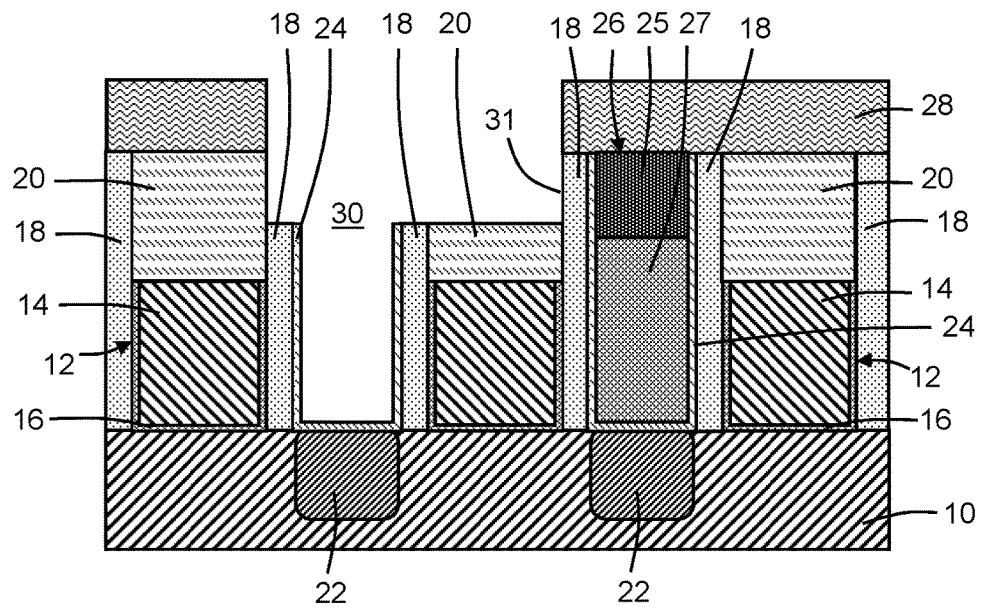

With reference to FIG. 2 in which like reference numerals refer to like features in FIG. 1 and at a subsequent fabrication stage of the processing method, the sacrificial dielectric layer 28 is patterned to form a cut opening 30 that selectively opens a path to a portion of at least one of the sacrificial contacts 26, and a portion of each revealed sacrificial contact 26 is subsequently removed to provide a trench silicide (TS) cut. To that end, a patterned mask layer (not shown) may be applied on the sacrificial dielectric layer 28 and an etching process, such as reactive ion etching (RIE), to remove the revealed portion of the sacrificial contact 26 to define the cut opening 30. In an alternative embodiment, the cut opening 30 may expose respective portions of multiple sacrificial contacts 26 that are removed over the area exposed by the cut opening 30. The sidewall spacers 18 and capping layers 20 may be recessed where exposed by the cut opening 30 but not removed by the etching process.

The cut opening 30 includes a narrow portion laterally between a sidewall spacer 18 on one of the gate structures 12 and a sidewall spacer 18 on the adjacent gate structure 12, as well as a wide portion the top surface 21 vertically above the narrow portion. The wide portion of the cut opening 30 has a larger area projected in a vertical direction than the narrow portion, and is laterally arranged to completely overlie the narrow portion.

Figure 3:
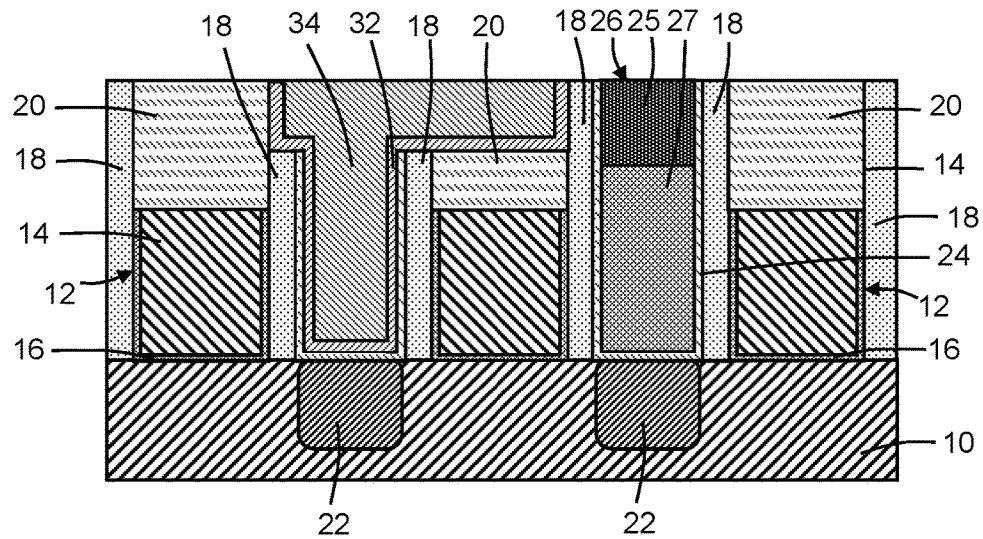

With reference to FIG. 3 in which like reference numerals refer to like features in FIG. 2 and at a subsequent fabrication stage of the processing method, a conformal dielectric layer 32 is applied as a liner that coats and covers the surfaces, generally indicated by reference numeral 31 (FIG. 2), exposed inside the cut opening 30, and that also forms on the top surface of the sacrificial dielectric layer 28 in a field area. A gap-fill dielectric layer 34 is applied that completes the filling of the cut opening 30 and that also forms on the top surface of the sacrificial dielectric layer 28 in the field area.

The conformal dielectric layer 32 may be deposited by a CVD process capable of depositing a conformal thin film on the surfaces 31 (FIG. 2) of the CESL 24, capping layers 20, and/or sidewall spacers 18 bordering the cut opening 30, and is arranged between the gap-fill dielectric layer 34 and the surfaces 31. The conformal dielectric layer 32 provides a tub conforming to the shape of the cut opening 30 in which the gap-fill dielectric layer 34 is surrounded and contained. The gap-fill dielectric layer 34 may be composed of a flowable dielectric material that is capable of filling of high-aspect ratio gaps. In an embodiment, the gap-fill dielectric layer 34 may be composed of a low-k dielectric material that is deposited by a flowable chemical vapor deposition (CVD) deposition process or by a capillary condensation process. The material of the conformal dielectric layer 32 has a higher mass density than the material of the gap-fill dielectric layer 34, which may be porous. In an embodiment, the layer 32 may be composed of carbon-incorporated silicon oxide (SiOC) with a dielectric constant in a range of 2.5-3.0, and the layer 34 may also be composed of carbon-incorporated silicon oxide (SiOC) with a dielectric constant in a range of 2.5-3.0 but characterized by a higher mass density than the SiOC of layer 32. The conformal dielectric layer 32 may be more robust than the gap-fill dielectric layer 34 due to the higher mass density and, for that reason, may protect covered structures from damage by wet chemicals seeping through the less-dense gap-fill dielectric layer 34 during subsequent cleans and etches.

The gap-fill dielectric layer 34 is planarized by, for example, a chemical mechanical polishing (CMP) process that planarizes the gap-fill dielectric layer 34 to the top surface of the sacrificial contacts 26. The planarization also removes the sacrificial dielectric layer 28 and the conformal dielectric layer 32 from the top surface of the sacrificial dielectric layer 28 with the layer 25 of the sacrificial contacts 26 functioning as a polish stop. Material removal during the CMP process combines abrasion and an etching effect that polishes each targeted material and may be conducted with a commercial tool using polishing pads and slurries selected to polish the targeted material(s).

The conformal dielectric layer 32 includes a section arranged vertically between the gap-fill dielectric layer 34 and source/drain region 22. The conformal dielectric layer 32 also includes sections that extend vertically from the section between the gap-fill dielectric layer 34 and source/drain region 22 and that are arranged laterally between the gap-fill dielectric layer 34 and the sidewall spacers 18.

Figure 4:
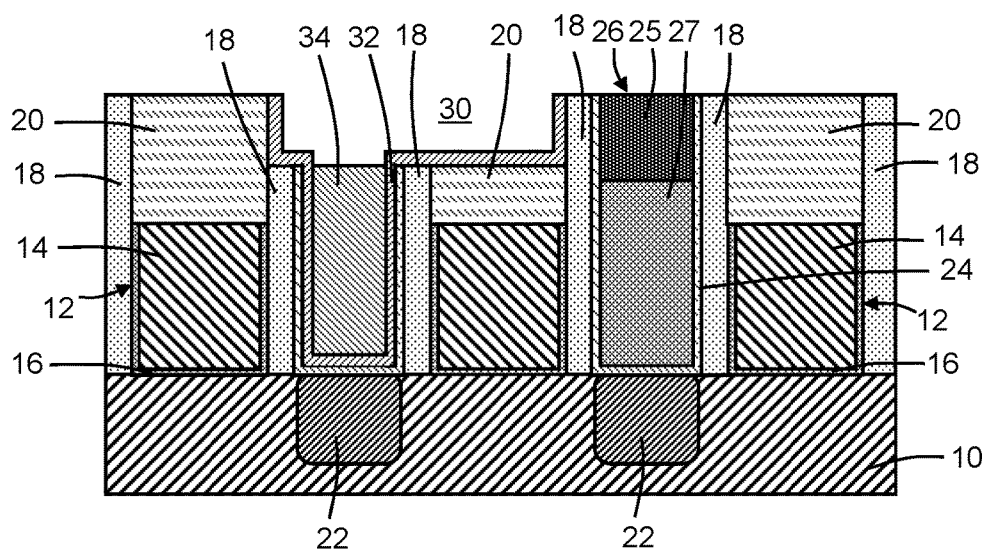

With reference to FIG. 4 in which like reference numerals refer to like features in FIG. 3 and at a subsequent fabrication stage of the processing method, the gap-fill dielectric layer 34 is recessed relative to the top surface of the sacrificial contacts 26 with an etch-back process that removes the material of the gap-fill dielectric layer 34 selective to the materials of the sidewall spacers 18, capping layers 20, and sacrificial contacts 26. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The etch-back process may be a plasma etching processes controlled such that the conformal dielectric layer 32 lining a wide portion of the cut opening 30 is exposed but not removed.

After etch-back, the gap-fill dielectric layer 34 is located in a narrow portion of the cut opening 30 that is laterally between the sidewall spacer 18 on one gate structure 12 and the sidewall spacer 18 on the immediately adjacent gate structure 12. The wide portion of the cut opening 30, which is vertically above the narrow portion and is separated from the source/drain region 22 by the narrow portion, is unfilled. The gap-fill dielectric layer 34 extends vertically to a height that is located at a level above the top surface 15 of the gate electrodes 14 of the gate structures 12.

An ultraviolet thermal process may be used to treat the gap-fill dielectric layer 34 following planarization and etch-back, and before subsequent processing steps, in order to recover plasma-induced damage incurred by the gap-fill dielectric layer 34 during etch-back. In an embodiment, the ultraviolet thermal process may include exposure to ultraviolet radiation in, for example, the ultraviolet C (UVC) band of wavelengths in the electromagnetic spectrum, while concurrently heating to an elevated temperature above ambient temperature, such as an elevated temperature less than or equal to 400° C. The ultraviolet thermal process may mechanically strengthen the gap-fill dielectric layer 34 through damage recovery, such as the reestablishment of broken chemical bonds. The extent of damage recovery may range from 90 percent to 95 percent.

Figure 5:
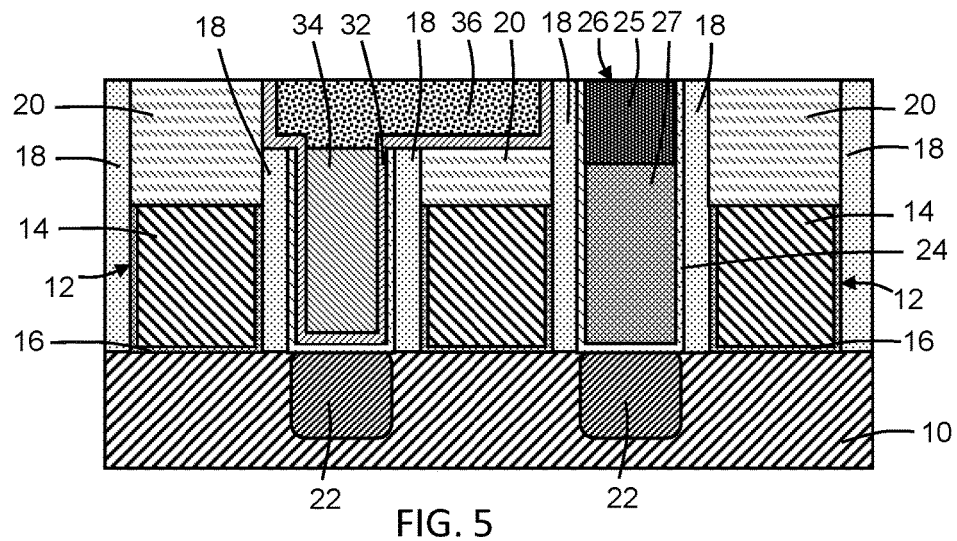

With reference to FIG. 5 in which like reference numerals refer to like features in FIG. 4 and at a subsequent fabrication stage of the processing method, a dielectric cap layer 36 is applied and planarized to the top surface of the sacrificial contacts 26 with a CMP process. The material of the dielectric cap layer 36 may have a dielectric constant (i.e., permittivity or k) that is greater than the dielectric constant of the gap-fill dielectric layers 32, 34. In an embodiment, the dielectric cap layer 36 may be composed of silicon carbonitride (SiCN) or silicon oxycarbide (SiCO) deposited by CVD and that have a dielectric constant in a range of 4.5 to 5.0. The chemical mechanical polishing (CMP) process may be employed to remove topography from the as-deposited dielectric cap layer 36 and provide a planarized top surface.

The dielectric cap layer 36 may be dimensioned and arranged to completely cover the gap-fill dielectric layer 34 such that the gap-fill dielectric layer 34 is buried beneath the dielectric cap layer 36 with a vertical arrangement between the source/drain region 22 and the dielectric cap layer 36. The complete coverage of the gap-fill dielectric layer 34 protects the gap-fill dielectric layer 34 during subsequent processing (e.g., subsequently processes involving a plasma or etchant) against damage.

Figure 6:
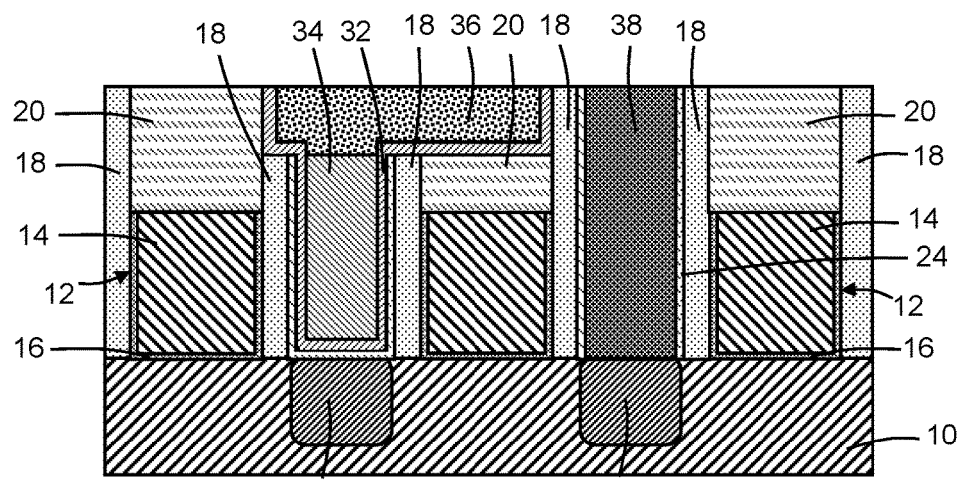
Figure 7:
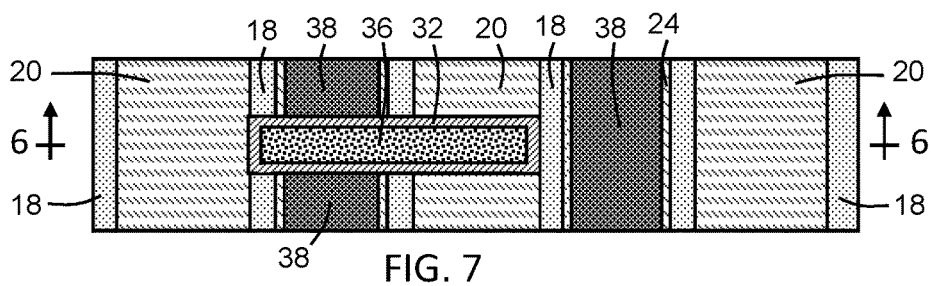

With reference to FIGS. 6, 7 in which like reference numerals refer to like features in FIG. 5 and at a subsequent fabrication stage of the processing method, the sacrificial contacts 26 may be replaced with trench silicide (TS) contacts 38 extending vertically to the source/drain regions 22. To that end, the sacrificial contacts 26 and the CESL 24 may be sequentially removed with etching processes having suitable etch chemistries. The TS contacts 38 may include a metal silicide, such as tungsten silicide ($WSi_2$), titanium silicide ($TiSi_2$), nickel silicide (NiSi), or cobalt silicide ($CoSi_2$), formed by salicidation adjacent to the source/drain regions 22, as well as a conductor, such as tungsten (W), filling the remainder of each space above the source/drain regions 22 opened by the removal of the sacrificial contacts 26 and CESL 24.

The conformal dielectric layer 32, gap-fill dielectric layer 34, and dielectric cap layer 36 contribute to a hybrid structure that provides a dielectric-filled cut that interrupts the continuity of the sacrificial contacts 26 and, subsequently, the continuity of the TS contacts 38 formed in association with the removal of the sacrificial contacts 26. The TS contacts 38 with the interrupted continuity may extend to the same source/drain region on opposite sides of the hybrid structure or to different source/drain regions on opposite sides of the hybrid structure. The dielectric cap layer 36 physically intervenes between the environment of the etching processes and the gap-fill dielectric layer 34 such that the gap-fill dielectric layer 34 is protected during the etching and/or cleaning processes used to remove the sacrificial contacts 26 and CESL 24. The gap-fill dielectric layer 34, which has the lowest dielectric constant from among the layers 32, 34, 36, is encapsulated on all sides by either the conformal dielectric layer 32 or the dielectric cap layer 36 that form a box surrounding the gap-fill dielectric layer 34, and constitutes the material contribution that is located between the gate electrodes 14.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first gate structure;
   a second gate structure;
   a source/drain region arranged between the first gate structure and the second gate structure;
   a first dielectric layer arranged in a space between the first gate structure and the second gate structure; and
   a second dielectric layer positioned as a cap on the first dielectric layer,
   wherein the first dielectric layer is arranged vertically between the second dielectric layer and the source/drain region, the first dielectric layer has a first dielectric constant, the second dielectric layer has a second dielectric constant that is greater than the first dielectric constant, the first dielectric layer is comprised of carbon-incorporated silicon oxide (SiOC), and the second dielectric layer is comprised of silicon carbonitride (SiCN) or silicon oxycarbide (SiCO).

2. The structure of claim 1 further comprising:
a conformal dielectric layer having a first section arranged vertically between the first dielectric layer and the source/drain region.

3. The structure of claim 2 wherein the conformal dielectric layer is comprised of carbon-incorporated silicon oxide (SiOC), and the SiOC of the conformal dielectric layer has a higher mass density than the SiOC of the first dielectric layer.

4. The structure of claim 2 further comprising:
a sidewall spacer adjacent to the first gate structure,
wherein the conformal dielectric layer has a second section extending vertically from the first section between the sidewall spacer and the first dielectric layer.

5. The structure of claim 2 wherein the first dielectric layer is formed in a cut opening, and the conformal dielectric layer is located on surfaces of the cut opening bordered by the first dielectric layer.

6. The structure of claim 1 wherein the second dielectric layer is arranged and dimensioned to completely cover the first dielectric layer.

7. The structure of claim 1 wherein the first dielectric layer and the second dielectric layer are located in a cut opening, and further comprising:
a first contact extending vertically to the source/drain region; and
a second contact extending vertically to the source/drain region,
wherein the first dielectric layer and the second dielectric layer are arranged laterally in the cut opening between the first contact and the second contact.

8. The structure of claim 1 wherein the first gate structure includes a gate electrode with a top surface, and the first dielectric layer extends from the source/drain region to a height that is vertically above the top surface of the gate electrode.

9. A structure comprising:
a first gate structure;
a second gate structure;
a source/drain region arranged between the first gate structure and the second gate structure;
a first dielectric layer arranged in a space between the first gate structure and the second gate structure;
a second dielectric layer positioned as a cap on the first dielectric layer;
a first contact extending vertically to the source/drain region; and
a second contact extending vertically to the source/drain region,
wherein the first dielectric layer is arranged vertically between the second dielectric layer and the source/drain region, the first dielectric layer has a first dielectric constant, the second dielectric layer has a second dielectric constant that is greater than the first dielectric constant, the first dielectric layer and the second dielectric layer are located in a cut opening, and the first dielectric layer and the second dielectric layer are arranged in the cut opening laterally between the first contact and the second contact.

10. The structure of claim 9 further comprising:
a conformal dielectric layer having a section arranged vertically between the first dielectric layer and the source/drain region.

11. The structure of claim 10 wherein the first dielectric layer and the conformal dielectric layer are each composed of carbon-incorporated silicon oxide (SiOC), the SiOC of the conformal dielectric layer has a higher mass density than the SiOC of the first dielectric layer.

12. The structure of claim 11 wherein the second dielectric layer is composed of silicon carbonitride (SiCN) or silicon oxycarbide (SiCO).

13. The structure of claim 10 wherein the conformal dielectric layer is located on surfaces of the cut opening bordered by the first dielectric layer and the second dielectric layer.

14. The structure of claim 9 wherein the second dielectric layer is arranged and dimensioned to completely cover the first dielectric layer.

15. A structure comprising:
a first gate structure;
a second gate structure;
a source/drain region arranged between the first gate structure and the second gate structure;
a first dielectric layer arranged in a space between the first gate structure and the second gate structure; and
a second dielectric layer positioned as a cap on the first dielectric layer,
wherein the first dielectric layer is arranged vertically between the second dielectric layer and the source/drain region, the first dielectric layer has a first dielectric constant, the second dielectric layer has a second dielectric constant that is greater than the first dielectric constant, the first gate structure includes a gate electrode with a top surface, and the first dielectric layer extends from the source/drain region to a height that is vertically above the top surface of the gate electrode.

16. The structure of claim 15 further comprising:
a conformal dielectric layer having a section arranged vertically between the first dielectric layer and the source/drain region.

17. The structure of claim 16 wherein the first dielectric layer and the conformal dielectric layer are each composed of carbon-incorporated silicon oxide (SiOC), the SiOC of the conformal dielectric layer has a higher mass density than the SiOC of the first dielectric layer.

18. The structure of claim 17 wherein the second dielectric layer is composed of silicon carbonitride (SiCN) or silicon oxycarbide (SiCO).

19. The structure of claim 15 wherein the second dielectric layer is arranged and dimensioned to completely cover the first dielectric layer.

* * * * *